United States Patent
Klaren et al.

(10) Patent No.: US 11,949,385 B2
(45) Date of Patent: *Apr. 2, 2024

(54) TRANSIENT STABILIZED CASCODE BIASING

(71) Applicant: pSemi Corporation, San Diego, CA (US)

(72) Inventors: Jonathan James Klaren, San Diego, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/178,280

(22) Filed: Mar. 3, 2023

(65) Prior Publication Data

US 2023/0283238 A1    Sep. 7, 2023

Related U.S. Application Data

(63) Continuation of application No. 17/205,556, filed on Mar. 18, 2021, now Pat. No. 11,601,094, which is a
(Continued)

(51) Int. Cl.
*H03F 3/04* (2006.01)
*H03F 1/02* (2006.01)
(Continued)

(52) U.S. Cl.
CPC ......... *H03F 1/0266* (2013.01); *H03F 1/0222* (2013.01); *H03F 1/223* (2013.01); *H03F 1/302* (2013.01); *H03F 2200/18* (2013.01)

(58) Field of Classification Search
CPC ...... H03F 1/0266; H03F 1/0222; H03F 1/223; H03F 1/302; H03F 2200/18; H03F 1/301;
(Continued)

(56) References Cited

U.S. PATENT DOCUMENTS 7,123,898 B2    10/2006    Burgener et al.
7,248,120 B2    7/2007    Burgener et al.
(Continued)

OTHER PUBLICATIONS

Nguyen, Khanh V., Office Action received from the USPTO dated Jul. 25, 2019 for U.S. Appl. No. 16/044,378, 15 pgs.
(Continued)

*Primary Examiner* — Khanh V Nguyen
(74) *Attorney, Agent, or Firm* — JAQUEZ LAND GREENHAUS & McFARLAND LLP; Alessandro Steinfl, Esq.

(57) ABSTRACT

A biasing circuit with high current drive capability for fast settling of a biasing voltage to a stacked cascode amplifier is presented. According to a first aspect, the biasing circuit uses transistors matched with transistors of the cascode amplifier to generate a boost current during a transition phase that changes the biasing voltage by charging or discharging a capacitor. The boost current is activated during the transition phase and deactivated when a steady-state condition is reached. According to a second aspect, the biasing circuit uses an operational amplifier in a feedback loop that forces a source node of a cascode transistor of a reference circuit, that is a scaled down replica version of the cascode amplifier, to be at a reference voltage. The high gain and high current capability of the operational amplifier, provided by isolating a high frequency signal processed by the cascode amplifier from the reference circuit, allow for a quick settling of the biasing voltage.

22 Claims, 12 Drawing Sheets

Related U.S. Application Data continuation of application No. 16/774,986, filed on Jan. 28, 2020, now Pat. No. 10,958,220, which is a continuation of application No. 16/044,378, filed on Jul. 24, 2018, now Pat. No. 10,587,225.

(51) Int. Cl.
*H03F 1/22* (2006.01)
*H03F 1/30* (2006.01)

(58) Field of Classification Search
CPC .... H03F 1/22; H03F 2200/294; H03F 3/1935; H03F 3/193; H03F 2200/372; H03F 3/16
USPC .......................................... 330/277, 296, 311
See application file for complete search history.

(56) References Cited

U.S. PATENT DOCUMENTS

| | | |
|---|---|---|
| 7,629,853 B2 | 12/2009 | Oishi |
| 7,890,891 B2 | 2/2011 | Stuber et al. |
| 8,742,502 B2 | 6/2014 | Brindle et al. |
| 8,779,859 B2 | 7/2014 | Su et al. |
| 9,148,088 B1 * | 9/2015 | Ding ................... H03F 1/0261 |
| 9,214,898 B2 | 12/2015 | Ran et al. |
| 9,219,445 B2 | 12/2015 | Nobbe et al. |
| 9,413,298 B2 | 8/2016 | Nobbe et al. |
| 9,716,477 B2 | 7/2017 | Wagh et al. |
| 9,837,965 B1 | 12/2017 | Wagh |
| 9,843,293 B1 | 12/2017 | Wagh et al. |
| 10,164,594 B2 * | 12/2018 | Katsumata ............... H03F 1/301 |
| 10,291,194 B2 * | 5/2019 | Ilkov .................... H03G 3/3036 |
| 10,587,225 B2 | 3/2020 | Klaren et al. |
| 10,601,414 B2 | 3/2020 | Mou |
| 10,958,220 B2 | 3/2021 | Klaren et al. |
| 11,601,094 B2 | 3/2023 | Klaren et al. |
| 2006/0226910 A1 | 10/2006 | Tanoi |
| 2017/0104458 A1 | 4/2017 | Cohen et al. |
| 2018/0083578 A1 | 3/2018 | Klaren et al. |
| 2020/0036341 A1 | 1/2020 | Klaren et al. |
| 2020/0244226 A1 | 7/2020 | Klaren et al. |
| 2021/0281220 A1 | 9/2021 | Klaren et al. |

OTHER PUBLICATIONS

Nguyen, Khanh V., Notice of Allowance received from the USPTO dated Oct. 25, 2019 for U.S. Appl. No. 16/044,378, 5 pgs.

PSemi Corporation, Response filed in the USPTO dated Oct. 15, 2019 for U.S. Appl. No. 16/044,378, 11 pgs.

Nguyen, Khanh V., Office Action received from the USPTO dated Aug. 5, 2020 for U.S. Appl. No. 16/774,986, 13 pgs.

Nguyen, Khanh V., Notice of Allowance received from the USPTO dated Nov. 16, 2020 for U.S. Appl. No. 16/774,986, 5 pgs.

Nguyen, Khanh V., Office Action received from the USPTO dated May 10, 2022 for U.S. Appl. No. 17/205,556, 16 pgs.

Nguyen, Khanh V., Notice of Allowance received from the USPTO dated Nov. 1, 2022 for U.S. Appl. No. 17/205,556, 5 pgs.

* cited by examiner

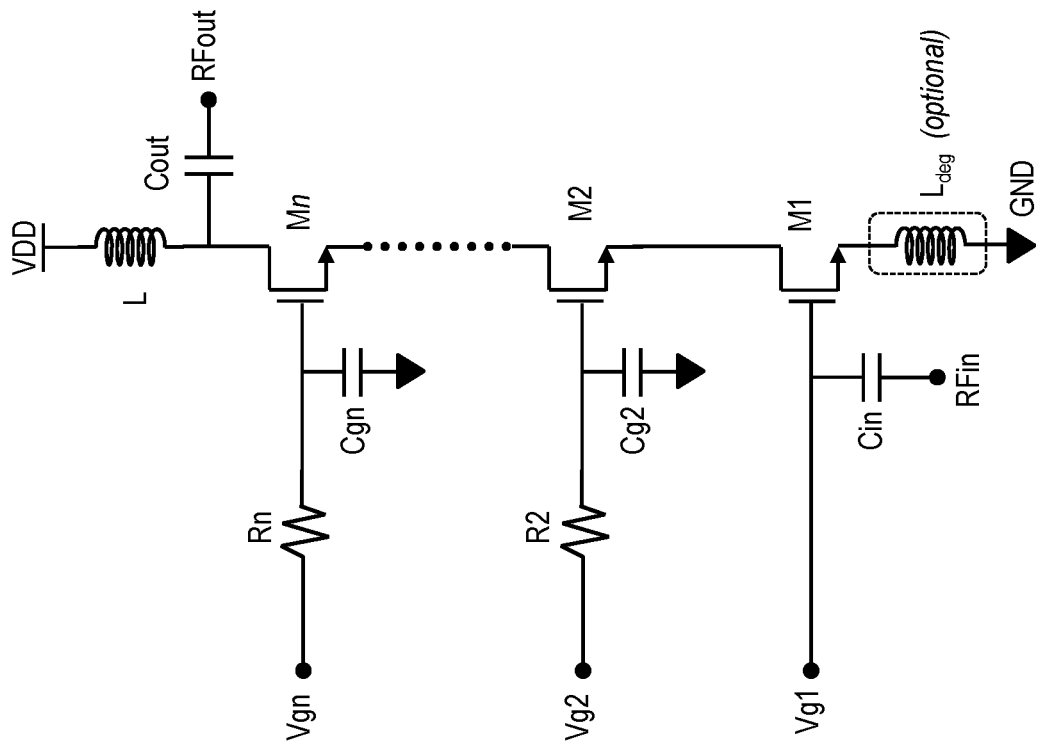
FIG. 1 *Prior Art*

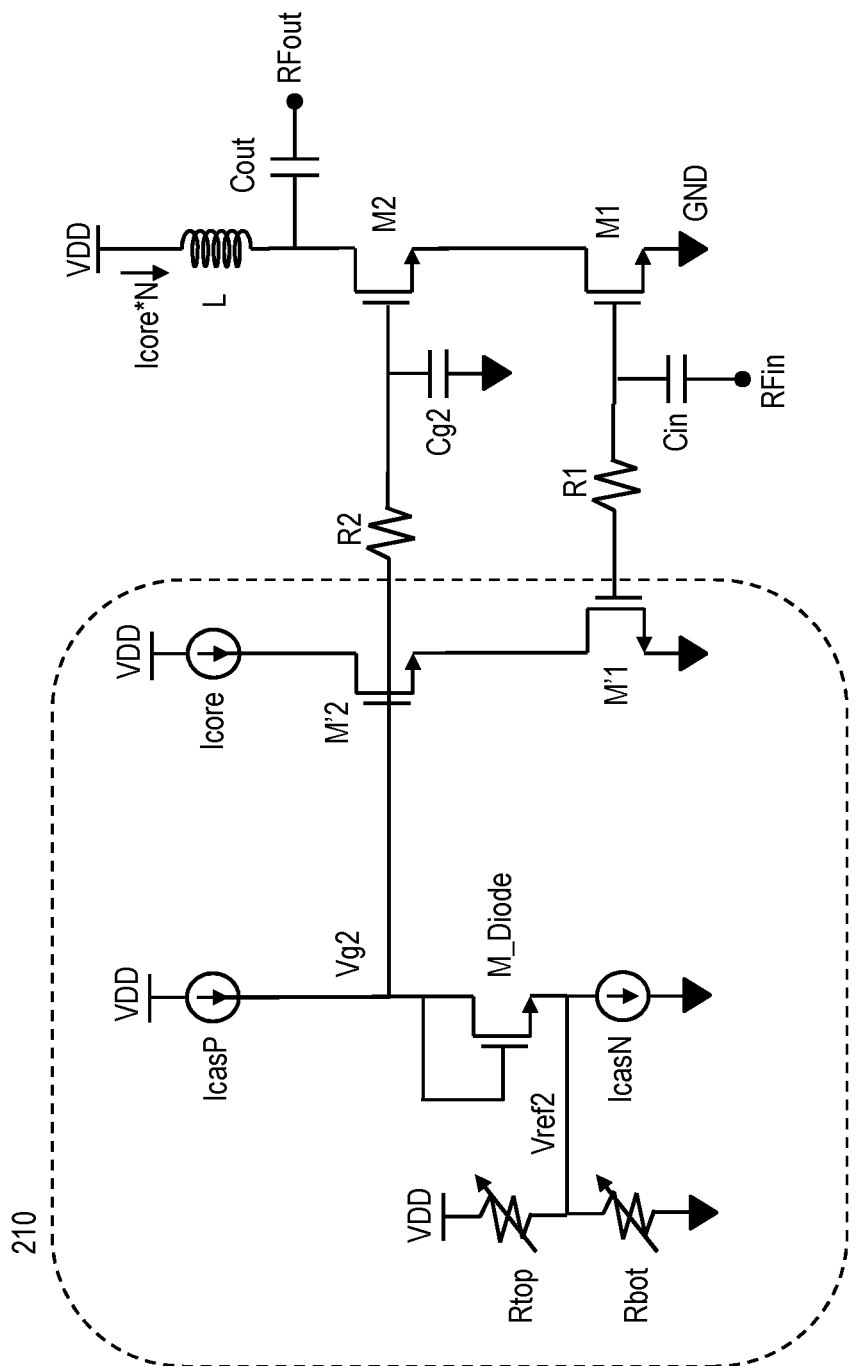
FIG. 2 *Prior Art*

TRANSIENT STABILIZED CASCODE BIASING

CROSS REFERENCE TO RELATED APPLICATIONS—CLAIM OF PRIORITY

This application is a continuation of commonly owned U.S. patent application Ser. No. 17/205,556, filed Mar. 18, 2021, entitled "Transient Stabilized Cascode Biasing", to issue on Mar. 7, 2023 as U.S. Pat. No. 11,601,094, the disclosure of which is incorporated herein by reference in its entirety. application Ser. No. 17/205,556 is a continuation of commonly owned U.S. patent application Ser. No. 16/774,986, filed Jan. 28, 2020, entitled "Transient Stabilized Cascode Biasing", now U.S. Pat. No. 10,958,220, issued Mar. 23, 2021, the disclosure of which is incorporated herein by reference in its entirety. application Ser. No. 16/774,986 is a continuation of commonly owned U.S. patent application Ser. No. 16/044,378, filed Jul. 24, 2018, entitled "Transient Stabilized Cascode Biasing", now U.S. Pat. No. 10,587,225 issued Mar. 10, 2020, the disclosure of which is incorporated herein by reference in its entirety.

The present application may be related U.S. Pat. No. 9,843,293, entitled "Gate Drivers for Stack Transistor Amplifiers", issued on Dec. 12, 2017, the disclosure of which is incorporated herein by reference in its entirety. The present application may also be related U.S. Pat. No. 7,248,120, entitled "Stacked Transistor Method and Apparatus", issued on Jul. 24, 2007, the disclosure of which is incorporated herein by reference in its entirety. The present application may also be related U.S. Pat. No. 9,716,477, entitled "Bias Control for Stacked Transistor Configuration", issued on Jul. 25, 2017, the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to U.S. Pat. No. 9,413,298, issued Aug. 9, 2016, entitled "Amplifier Dynamic Bias Adjustment for Envelope Tracking", the disclosure of which is incorporated herein by reference in its entirety. The present application may also be related to U.S. Patent Publication No. 2018/0083578, published Mar. 22, 2018, entitled "Cascode Amplifier Bias Circuits", the disclosure of which is incorporated herein by reference in its entirety.

TECHNICAL FIELD

The present teachings relate to amplifiers used in radio frequency (RF) circuits. In particular, the present application relates to gate biasing for amplifiers comprising stacked transistors which can operate in different modes.

BACKGROUND

In recent years, stacked cascode amplifiers, which use a plurality of transistors arranged as a stack (stacked transistors) in an amplification stage of the amplifiers, have become predominant in radio frequency (RF) applications where high power, high voltage outputs are desired. Due to the higher number of transistors in the stack, voltage handling performance of the amplifier is increased, thereby allowing the high power, high voltage outputs. Stacked or cascoded amplifiers are also common in low noise amplifiers where the benefits to gain an isolation as well as linearity are realized in addition to voltage handling. Since the stacked transistors comprise individual low voltage transistors which can tolerate a voltage substantially lower than the output voltage of the amplifier, it is important to bias the low voltage transistors of the stack so to maintain operation within their tolerable voltage range. Such voltage compliance of the low voltage transistors of the stack must be maintained whether the amplifier operates in an active mode transmitting a signal, or in a standby mode not transmitting a signal. In addition, as performance characteristics of such amplifiers may be based on the biasing voltages to the transistors of the stack, it is important to quickly stabilize such biasing voltages so to reduce a transition phase between different operating modes of the amplifiers. This in turn can allow reduction in settling times of the amplifier when switching, for example, between activated and deactivated states of the amplifier, bands of operation, and/or gain settings of the amplifier, and therefore allow for quicker connections and reduced data loss due to longer settling times of the amplifier.

FIG. 1 shows a simplified schematic of a prior art stacked cascode (RF) amplifier (100). As shown in FIG. 1, the stacked cascode amplifier (100) can comprise a stack of n FET transistors (M1, M2, ..., Mn) that include an input transistor M1, and cascode transistors (M2, ..., Mn), including an output transistor Mn. An input RF signal, $RF_{in}$, provided at an input terminal of the amplifier (100) is routed to a gate of the input transistor, M1, and is amplified by the amplifier (100). A corresponding amplified output RF signal, $RF_{out}$, is provided at a drain of the output transistor, Mn, and routed to an output terminal of the amplifier. Decoupling capacitors (Cin, Cout) can be used to decouple low frequency (e.g., DC) biasing voltages provided to the stack of transistors (transistor stack) from the $RF_{in}$ and $RF_{out}$ signals. A supply voltage, $V_{DD}$, is provided to the drain of the output transistor, Mn, through an inductor, L, and a reference potential (e.g., GND), representing for example an AC ground, is connected to a source of the input transistor M1. In some implementations, as for example described in the above referenced U.S. Patent Publication No. 2018/0083578, the disclosure of which is incorporated herein by reference in its entirety, the source of the input transistor may be optionally connected to the AC ground via degeneration elements, such as, for example, the degeneration inductor $L_{deg}$ shown in FIG. 1. A person skilled in the art is well aware of such implementations, as used, for example, in design of low noise amplifiers (LNA's) of a receive path of an RF front end system.

With continued reference to FIG. 1, biasing voltages (Vg2, ..., Vgn) are provided to gates of the cascode transistors (M2, ..., Mn) through resistors (R2, ..., Rn) connected to the gates of the cascode transistors, and a bias voltage Vg1 is provided to the gate of the input transistor M1. Although not shown in FIG. 1, biasing voltage Vg1 may also be provided to the gate of the input transistor via a resistor, as shown, for example, in FIG. 2. Such resistors may be used, in combination with the gate capacitors (Gg2, ..., Cgn), to decouple any noise from a biasing circuit that generates the biasing voltages into the stacked cascode amplifier and/or decouple any residual RF signal at gates of the cascode transistors (M2, ..., Mn) from the biasing circuit. Gate capacitors (Cg2, ..., Ggn) are coupled between gates of the cascode transistors (M2, ..., Mn) and the reference potential, GND. It should be noted that n is an integer number that can be of any value equal to, or greater than, two. A value of n may be based on a voltage withstand capability of the transistors (M1, M2, ..., Mn) and a high value of an RF voltage at the drain of the output transistor Mn. More description of such prior art stacked cascode amplifier (100) can be found, for example, in the above referenced U.S. Pat. No. 7,248,120, the disclosure of which is incorporated herein by reference in its entirety.

Biasing voltages to the stacked cascode amplifier (100) of FIG. 1 may be provided by biasing circuits according to various implementations known in the art. Some such biasing circuits are described, for example, in the above referenced U.S. Pat. Nos. 9,843,293, 7,248,120, 9,716,477, and U.S. Patent Publication No. 2018/0083578, the disclosures of which are incorporated herein by reference in their entirety. Also, as described, for example, in the above referenced U.S. Pat. No. 9,716,477, the supply voltage $V_{DD}$, may be a fixed voltage or a variable voltage. The variable voltage may be provided, for example, via a DC-DC converter or a voltage regulator. In some exemplary configurations, the supply voltage can vary under control of an external control signal. In some configurations, the control signal can be a function of an envelope signal of the input RF signal, RFin, or the output RF signal, $RF_{out}$. Detailed description of biasing methods and apparatus for stacked transistor amplifiers operating from a variable supply voltage can be found, for example, in the above referenced U.S. Pat. Nos. 9,219,445, and 9,413,298, the disclosures of which are incorporated herein by reference in their entirety.

FIG. 2 shows an exemplary prior art biasing circuit (210) that provides a biasing voltage, Vg2, to the gate of the cascode transistor M2 for an exemplary case of a stacked cascode amplifier (M1, M2) with a non-limiting height of n=2. It should be noted that as discussed above in relation to the stacked cascode amplifier (100) of FIG. 1, such height can be represented by any number n that is equal to, or greater than, two. Accordingly, each of the gate voltages to the cascode transistors (M2, . . . , Mn) may be provided via a biasing circuit that is similar to one depicted in FIG. 2 (e.g., FIG. 5A later described). Also, not shown in FIG. 2, is biasing of the gate of the input transistor, M1, which is beyond the scope of the present disclosure, and which may be provided independently from the biasing voltage Vg2. Some exemplary biasing circuits for biasing the gate of the input transistor, M1, can be found, for example, in the above referenced U.S. Pat. No. 9,716,477 and U.S. Patent Publication No. 2018/0083578, the disclosures of which are incorporated herein by reference in their entirety.

As can be seen in FIG. 2, the biasing circuit (210) comprises a current mirror branch formed by a reference cascode circuit (M'1, M'2) that is a scaled down (e.g., $\frac{1}{20}^{th}$ or less, such as, for example, $\frac{1}{30}^{th}$, $\frac{1}{40}^{th}$, . . . , $\frac{1}{N}^{th}$ with N≥20) replica version of the cascode amplifier circuit (M1, M2), so that a current (Icore) flowing through the transistors (M'1, M'2) is mirrored to provided a current (Icore*N) flowing thorough the transistors (M1, M2). The transistors M'1 and M'2 are smaller size versions of the transistors M1 and M2 respectively, so that for same biasing voltages applied to the amplifier circuit (M1, M2) and the reference circuit (M'1, M'2), a ratio of the biasing currents through the reference circuit (M'1, M'2) and the amplifier circuit (M1, M2) is substantially equal to a ratio of the sizes of the transistors of the two circuits. Accordingly, if a current Icore flows through the reference circuit (M'1, M'2), then a current Icore*N flows through the amplifier circuit (M1, M2), where N is a ratio of the size of the amplifier circuit to the size of the reference circuit, or in other words, N is a scaling factor between the two circuits. For example, if the transistors M'1, M'2 of the cascode reference circuit (M'1, M'2) are $\frac{1}{100}$ of the size of the transistors M1, M2 of the cascode amplifier (M1, M2) respectively, the scaling factor N would be 100.

It should be noted that the size of such transistors may be defined in terms of different aspects of the transistors, such as, for example, transistor area, gate length, gate width, etc., so long as a same aspect of the transistors is compared.

With further reference to FIG. 2, gate voltage Vg2 for biasing of the cascode transistor M2 is provided via a combination of a resistive voltage divider (Rtop, Rbot), a diode-connected transistor, M_Diode, and current sources IcasP and IcasN. The current source IcasP is coupled to a common gate-drain node of the diode-connected transistor, M_diode, and the current source IcasN is coupled to a source node of the diode-connected transistor, M_diode. The resistive voltage divider (Rtop, Rbot) generates a reference voltage, Vref2, at the source node of the diode-connected transistor, M_diode, based on a supply voltage $V_{DD}$. In turn, the diode-connected transistor, M_diode, generates the gate voltage, Vg2, that is one diode drop above the reference voltage, Vref2. Finally, current from IcasP or IcasN serve to provide a current for the diode connected transistor M_diode and also charge or discharge the Vg2 node such that Vg2 is equal to Vref2+Vdiode, where Vdiode is the voltage across the diode-connected transistor M_diode.

With continued reference to FIG. 2, by selecting the diode-connected transistor, M_diode, to have a same current density as the cascode transistors M'2 and M2, a person skilled in the art would understand that in a steady-state condition of the circuit shown in FIG. 2, where the reference voltage, Vref2, provided by the resistive voltage divider (Rtop, Rbot) and the gate voltage Vg2 are steady, a gate-to-source voltage, Vgs, of the diode-connected transistor, M_diode, is equal to a gate-to-source voltage, Vgs, of the cascode transistors M'2 and M2. In turn, this allows to precisely set, for example, a drain voltage of the input transistor M1 to be equal to the reference voltage, Vref2. As used herein, and as it is well known to a person skilled in the art, the expression "current density" refers to a ratio of a current through a transistor (e.g., drain current) to a size of the transistor, where the size can be any of a transistor area, a gate length, a gate width, etc.

During the steady-state condition of the circuit shown in FIG. 2, the voltage Vref2 and the voltage Vg2 are substantially fixed, and therefore no current flows into the gate capacitor Cg2 and no current flows from the source of the diode-connected transistor M_diode into the resistive voltage divider (Rtop, Rbot). Accordingly, the currents IcasP and IcanN are equal.

Considering a transition phase of the circuit shown in FIG. 2, defined by a change of the biasing voltage Vg2 corresponding to a desired operation of the cascode amplifier (M1, M2). Such transition phase may correspond to, for example, an activation state of the amplifier after a deactivation state of the amplifier, or a change in a frequency band (and therefore operating frequency) of the amplifier, or a change in a gain of the amplifier. As the reference voltage, Vref2, sets the biasing voltage, Vg2, such transition phase may include changing values of the resistors Rtop and/or Rbot so to change the reference voltage, Vref2. As can be seen in FIG. 2, such resistors may be programmable/settable resistors, either according to discrete values or continuous values. It should be noted that although in the exemplary case of the prior art configuration of FIG. 2, a resistive voltage divider is used to generate the reference voltage, Vref2, a person skilled in the art would know that other circuit implementations may also be used, such as, for example, circuits using an operational amplifier and/or digital-to-analog devices. Furthermore, in a case where the transition phase corresponds to activation of the amplifier after a deactivation, or vice versa, the transition phase may also include activation/deactivation of the current sources (e.g., Icore, IcasP, IcasN) which may have been turned off during the deactivated states of the cascode amplifier (M1, M2) for power conservation purposes.

During the transition phase of the circuit shown in FIG. 2, current from IcasP may flow into the gate capacitor, Cg2, to charge up the capacitor to a new (higher) voltage value of Vg2. Alternatively, a current may flow from the capacitor Cg2 into the diode-connected transistor to discharge the capacitor for a new (lower) voltage value of Vg2. For this, a maximum current available for the charging or discharging of the capacitor Cg2 is provided by the maximum current of the current source IcasP and the maximum current of the current source IcasN respectively. As such maximum currents are set to be sufficiently low so as to not drain substantial power from the supply $V_{DD}$ (and therefore from a battery generating $V_{DD}$), charging and discharging speed of the capacitor Cg2, and therefore settling time of the amplifier's biasing conditions, may be compromised in favor of lesser power consumption of the circuit. A motivation for the teachings according to the present disclosure is to remove a need for such compromise, and therefore reduce the settling times while maintaining a low power consumption of the circuit.

SUMMARY

According to a first aspect of the present disclosure, a circuit arrangement is presented, the circuit arrangement comprising: a stacked cascode amplifier comprising an input transistor and one or more cascode transistors, the one or more cascode transistors comprising an output transistor, wherein the input transistor is configured to receive an RF signal and the output transistor is configured to output an amplified version of the RF signal; a reference circuit that is a scaled down version of the stacked cascode amplifier, the reference circuit coupled to the stacked cascode amplifier via respective gate nodes; and a biasing circuit configured to provide a biasing voltage to at least one gate node of a transistor of the one or more cascode transistors and a gate node of a respective transistor of the reference circuit, wherein the biasing circuit comprises a feedback loop that senses a voltage at a source node of the respective transistor of the reference circuit and controls the biasing voltage so that a sensed voltage at said source node is equal to a reference voltage.

According to second aspect of the present disclosure, a method for biasing a stacked cascode amplifier is presented, the method comprising: providing a reference circuit that is a scaled down version of the stacked cascode amplifier; coupling gate nodes of the stacked cascode amplifier to respective gate nodes of the reference circuit via respective resistors; based on the coupling, isolating an RF signal processed by the stacked cascode amplifier from the reference circuit; and controlling, via a feedback loop with higher gain, a biasing voltage to a gate node of a cascode transistor of the stacked cascode amplifier based on a voltage sensed at a source node of a respective transistor of the reference circuit, wherein the higher gain is provided by the isolating.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1 shows a simplified schematic of a prior art stacked cascode (RF) amplifier.

FIG. 2 shows an exemplary prior art biasing circuit that provides a biasing voltage, Vg2, to a gate of a cascode transistor of a stacked cascode amplifier.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios) having a plurality of devices, such as for example, transistors (e.g., MOSFETs). Persons skilled in the art will appreciate that such electrical circuits comprising transistors can be arranged as amplifiers.

Figure 3A:
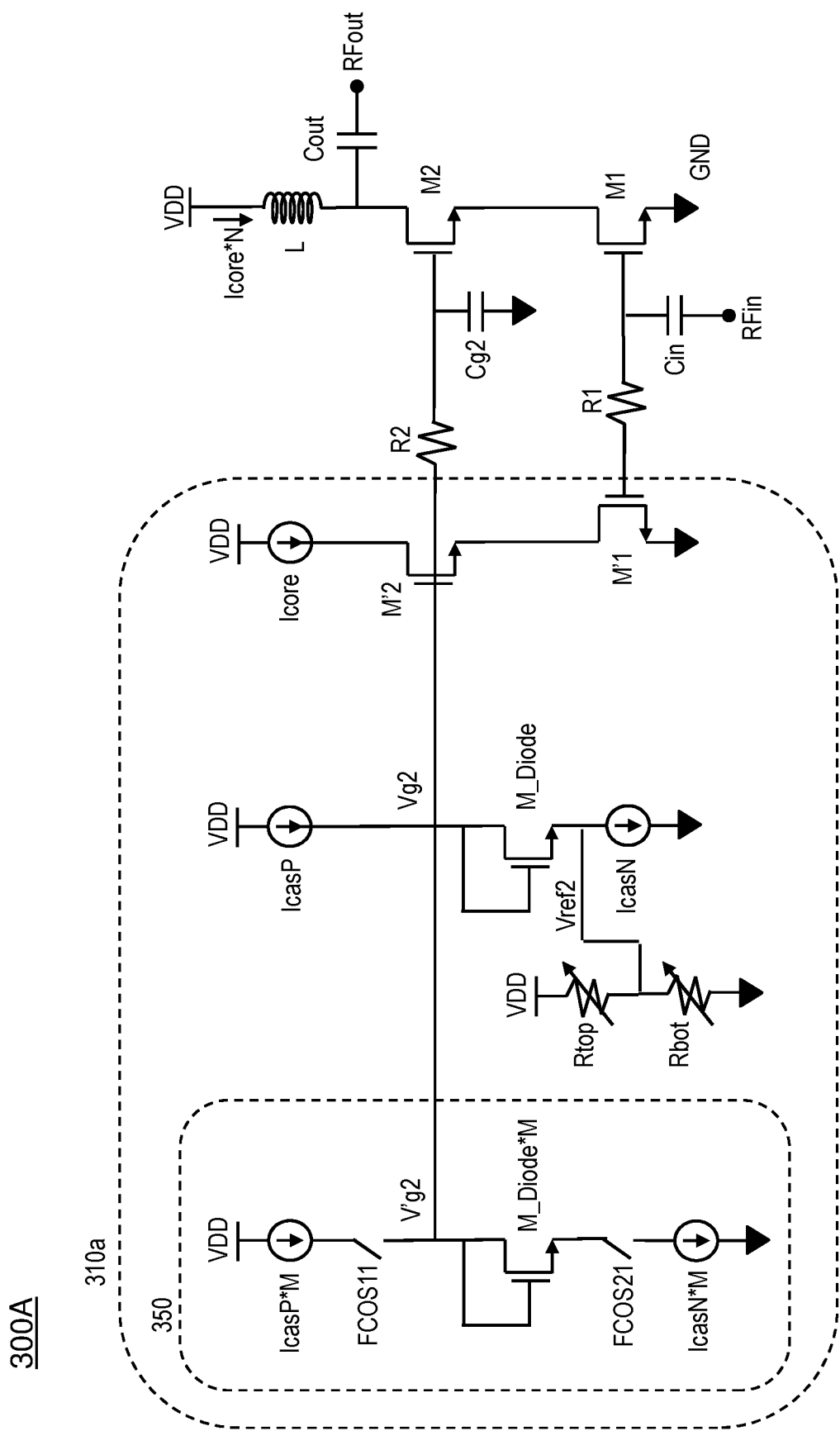
FIG. 3A shows a biasing circuit according to an embodiment of the present disclosure comprising a current boost circuit that can be selectively activated to provide a current boost for a shorter settling time of a biasing voltage at a gate of a cascode transistor of a stacked cascode amplifier.

FIG. 3A shows a biasing circuit (310a) according to an embodiment of the present disclosure, based on the biasing circuit (210) described above in relation to FIG. 2, further comprising a current boost circuit (350) that can be selectively activated to provide a current boost for a shorter settling time of the biasing voltage, Vg2, provided to the gate of the cascode transistor, M2, of the stacked cascode amplifier (M1, M2). The current boost circuit (350) comprises a diode-connected transistor, M_Diode*M, and current sources IcasP*M and IcasN*M, where "*M" denotes a multiplicative size factor (i.e., scaling factor) with reference to corresponding elements M_Diode, IcasP and IcasN of the biasing circuit (310a). The current source IcasP*M is selectively coupled (and decoupled) to a common gate-drain node of the diode-connected transistor, M_diode*M, via a switch, FCOS11, and the current source IcasN*M is selectively coupled (and decoupled) to a source node of the diode-connected transistor, M_diode*M, via a second switch, FCOS21. A person skilled in the art would realize that when the switches FCOS11 and FCOS21 are closed, the biasing circuit (310a) of FIG. 3A provides a same functionality as the biasing circuit (210) of FIG. 2 but with added current charging and discharging capability. In other words, as related to the charging capability of the gate capacitor Cg2, the biasing circuit (310a) according to the present teachings can be considered as a scaled up version (i.e., scale factor (M+1)/1) of the biasing circuit (210) of FIG. 210) when the switches FOCS1 and FCOS21 are closed, and a same scale version of the circuit (210) of FIG. 210) when the switches FOCS1 and FCOS21 are open.

According to an embodiment of the present disclosure, the current density of the diode-connected transistor M_diode*M is selected to be same as the current density of the diode-connected transistor M_diode. Accordingly, in the activated state of the current boost circuit (350) provided by closing of the switches FCOS11 and FCOS21, due to the same current densities and the scaling factor, *M, drain voltage V'g2 at the common gate-drain node of the diode-connected transistor M_diode*M is equal (substantially equal) to the drain voltage Vg2 at the common gate-drain node of the diode connected transistor M_diode. This allows activating and deactivating of the current boost circuit (350) without affecting the gate voltage Vg2.

With further reference to the current boost circuit (350) of FIG. 3A, when activated, boosts of current provided by IcasP*M and by IcasN*M can combine with currents provided by IcasP and IcasN to respectively charge and discharge the gate capacitor Cg2, and thereby reducing a settling time of the gate voltage Vg2. Once settled, the current boost circuit (350) may be deactivated by opening the switches FCOS11 and FCOS21 without affecting or perturbing the gate voltage Vg2 as described above. When the gate voltage Vg2 has settled, the circuit depicted in FIG. 3A is basically in a steady-state condition and essentially no current flows in or out the gate capacitor Cg2.

According to an embodiment of the present disclosure, activation of the current boost circuit (350) may be provided via a pulse signal that controls the switches FCOS11 and FCOS21, the pulse signal having a time duration so to allow charging or discharging of the gate capacitor Cg2 to a desired value of the gate biasing voltage, Vg2, in view of the available current boost. According to an embodiment of the present disclosure, such time duration may be programmable and controlled by a signal aware controller, such as, for example, a transceiver unit (not shown) as is well known in the art. Activation of the current boost circuit (350) may be based on different conditions of operation of the cascode amplifier (M1, M2) that are obtained through, for example, switching from a deactivated amplifier to an activated amplifier, or switching from one frequency band of operation to another, or switching from one gain setting of the amplifier to another, which conditions may dictate different amounts of charging or discharging of the gate capacitor, Cg2, to provide a corresponding gate voltage Vg2. Programmability of the pulse time duration may therefore allow to reduce wasted energy by deactivating the current sources IcasP*M and IcanN*M at a time immediately after a time required for settling of the gate voltage Vg2.

With continued reference to the current boost circuit (350) of FIG. 3A, according to an embodiment of the present disclosure, closing and opening of the switches FCOS11 and FCOS21 is performed in synchrony so to reduce any deviation in voltage at the common gate-drain node V'g2 with respect to the voltage Vg2. A person skilled in the art clearly realizes that during a transient condition associated with opening or closing of the switches FCOS11 and FCOS21, current may flow through a conduction path provided between the nodes V'g2 and Vg2 until a steady state condition is reached where no current flows between the two nodes. Accordingly, although the two nodes V'g2 and Vg2 are electrically connected, they may assume different voltage-current behaviors during transient conditions. Additionally, the closing of the switches FCOS11 and FCOS21, and therefore activation of the current boost circuit (350), may be in synchrony with a change in the condition of operation of the cascode amplifier (M1, M2). Such change in the condition of operation may include a change in the value of the reference voltage, Vref2, and/or activation of the current source, Icore, and/or a change in any other parameters that affect operation of the circuit shown in FIG. 3A. Such change in the condition of operation may be based on a decision performed by the same signal aware controller (e.g., a transceiver) that generates the pulse signal to control the switches FCOS11 and FCOS21.

Figure 3B:
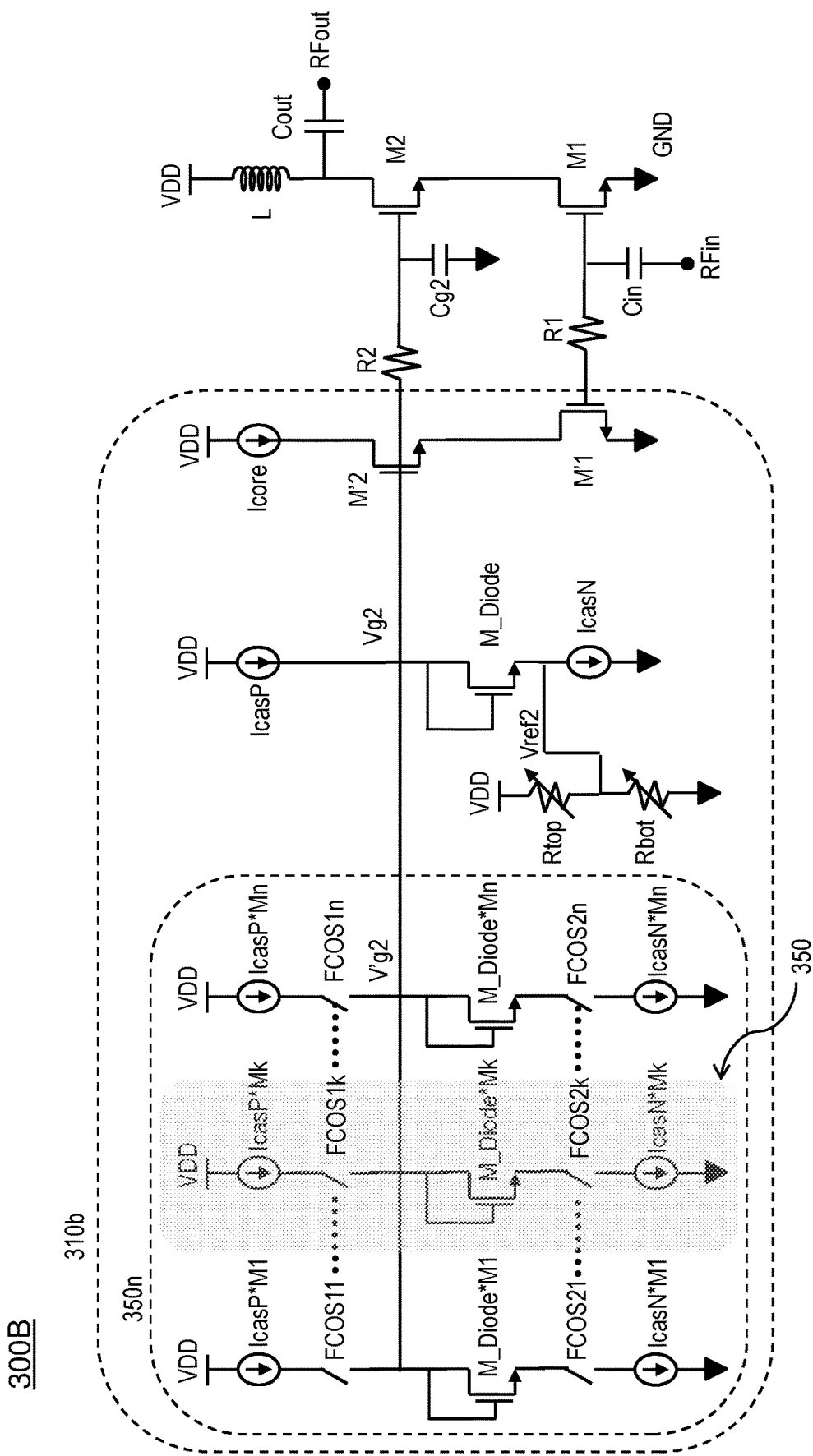
FIG. 3B shows a biasing circuit according to an embodiment of the present disclosure comprising a programmable current boost circuit that comprises a plurality of individual current boost circuits that can be selectively and independently activated to provide different combined current boosts for a desired settling time of a biasing voltage at a gate of a cascode transistor of a stacked cascode amplifier.

FIG. 3B shows a biasing circuit (310b) according to an embodiment of the present disclosure comprising a programmable current boost circuit (350n) that comprises a plurality of individual current boost circuits (350) similar to one described above with reference to FIG. 3A, arranged in a parallel configuration. Each such current boost circuit (350) can be selectively and independently activated via respective switches (FCOS1k, FCOS2k) to provide different combined current boosts for a desired settling time of a biasing voltage Vg2 at the gate of a cascode transistor M2 of a stacked cascode amplifier (M1, M2). Principle of operation of each of the current boost circuits (350) of the programmable current boost circuit (350n) is same as described above. A person skilled in the art would clearly understand that concurrent activation of a plurality of such current boost circuits (350) results in corresponding currents to combine (i.e., via summation of currents) at the common node V'g2, and therefore allow, based on a number of concurrent activated current boost circuits (350), to charge and discharge the gate capacitor Cg2 according to a programmable current. In other words, the biasing circuit (310b) of the present teachings allows for a programmable settling time of the gate voltage Vg2.

Figure 3C:
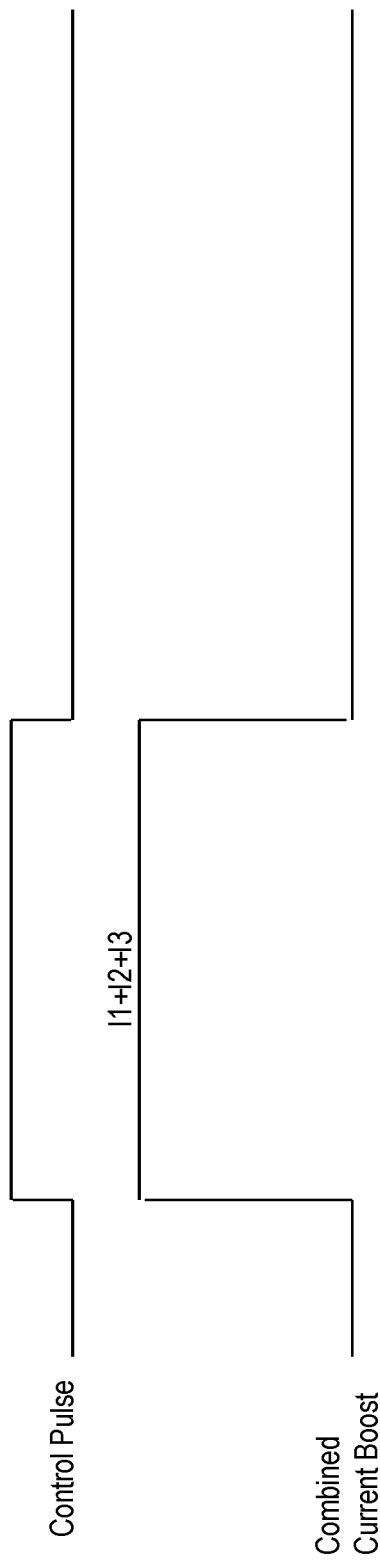
FIG. 3C shows graphs representing an exemplary pulse timing provided to a plurality of current boost circuits and a resulting combined current boost of the programmable current boost circuit of FIG. 3B.

With continued reference to the biasing circuit (310b) of FIG. 3B, according to an exemplary embodiment of the present disclosure, activation and deactivation of each of the plurality of current boost circuits (350) may be selectively performed by a same pulse signal, or different pulse signals with same, or essentially same, edge timings. In other words, when a group of the current boost circuits (350) is activated, they provide, in combination, a constant current boost for charging or discharging the gate capacitor Cg2. This allows for a substantially same behavior as provided in the biasing circuit (310a) of FIG. 3A, with the difference that a value of the current boost can be programmatically changed. FIG. 3C shows pulse timing and resulting combined current boost for such configuration for an exemplary case where three current boost circuits (350) are selected, each providing a boost of current I1, I2 and I3.

Figure 3D:
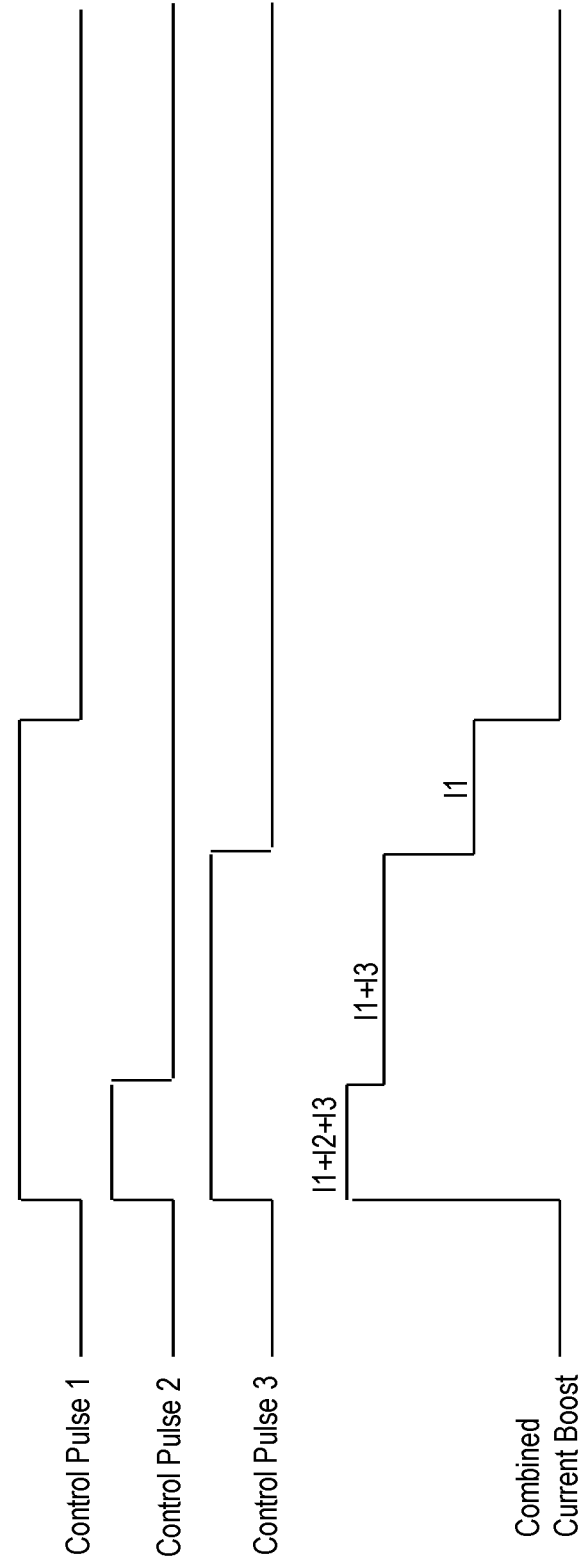
FIG. 3D shows graphs representing exemplary different pulse timings provide to a plurality of current boost circuits and a resulting combined current boost of the programmable current boost circuit of FIG. 3B.

With further reference to the biasing circuit (310b) of FIG. 3B, according to another exemplary embodiment of the present disclosure, activation and deactivation of each of the plurality of current boost circuits (350) may be selectively performed by a different pulse signal having one or both of a rising edge and a trailing edge at different timings. This allows to shape a charging and/or discharging profile of the capacitor Cg2 by providing a current boost that varies with time, as shown in FIG. 3D. FIG. 3D shows three different pulse timings for activation of respective three current boost circuits (350), each providing a respective current boost I1, I2 and I3. A resulting combined current boost provides a profile for charging of the gate capacitor Cg2. A person skilled in the art would clearly realize that such profile can be of any shape and function of activation and deactivation of different current boost circuits (350) during the charging of the capacitor Cg2. It should be noted that although in the exemplary case depicted in FIG. 3D all three current boost circuits (350) are activated at a same start time, a person skilled in the art would clearly realize that any order of activation/deactivation timing for a selected current boost circuit (350) for charging of the gate capacitor Cg2 may be envisioned.

With reference back to FIG. 3A, a person skilled in the art would realize that when the current boost circuit (350) is first activated, which may also include activation of corresponding current sources IcasP and IcasN, a time for setting of such current sources may be different (e.g., active state currents reached at different times, or two switches closed at different times) which can therefore induce undesired perturbations of the voltage at node Vg2, bringing such voltage to a level different from one set by the reference voltage, Vref2. Likewise, when the current boost circuit (350) is deactivated, which may also include deactivation of the current sources IcasP and IcasN, a turn off time of such current sources may be different (e.g., deactivated state currents reached at different times, or two switches open at different times) which can also induce perturbations of the voltage at node Vg2, bringing such voltage to a level different from one set by the reference voltage, Vref2. The voltage perturbation related to the activation of the current boost circuit (350) may be considered of a lesser impact since a boost current follows to quickly settle the voltage at node Vg2, and therefore at the gate of the cascode transistor M2, to the desired value. However, in the case of the voltage perturbation related to the deactivation of the current boost circuit (350), since no current boost is available, a larger settling time may be required to bring the voltage at node Vg2 back to the desired value. It follows that according to an embodiment of the present disclosure, coupling and decoupling of the current boost circuit (350) to the node Vg2 may be performed by a switch, SW1, as shown in FIG. 4A.

Figure 4A:
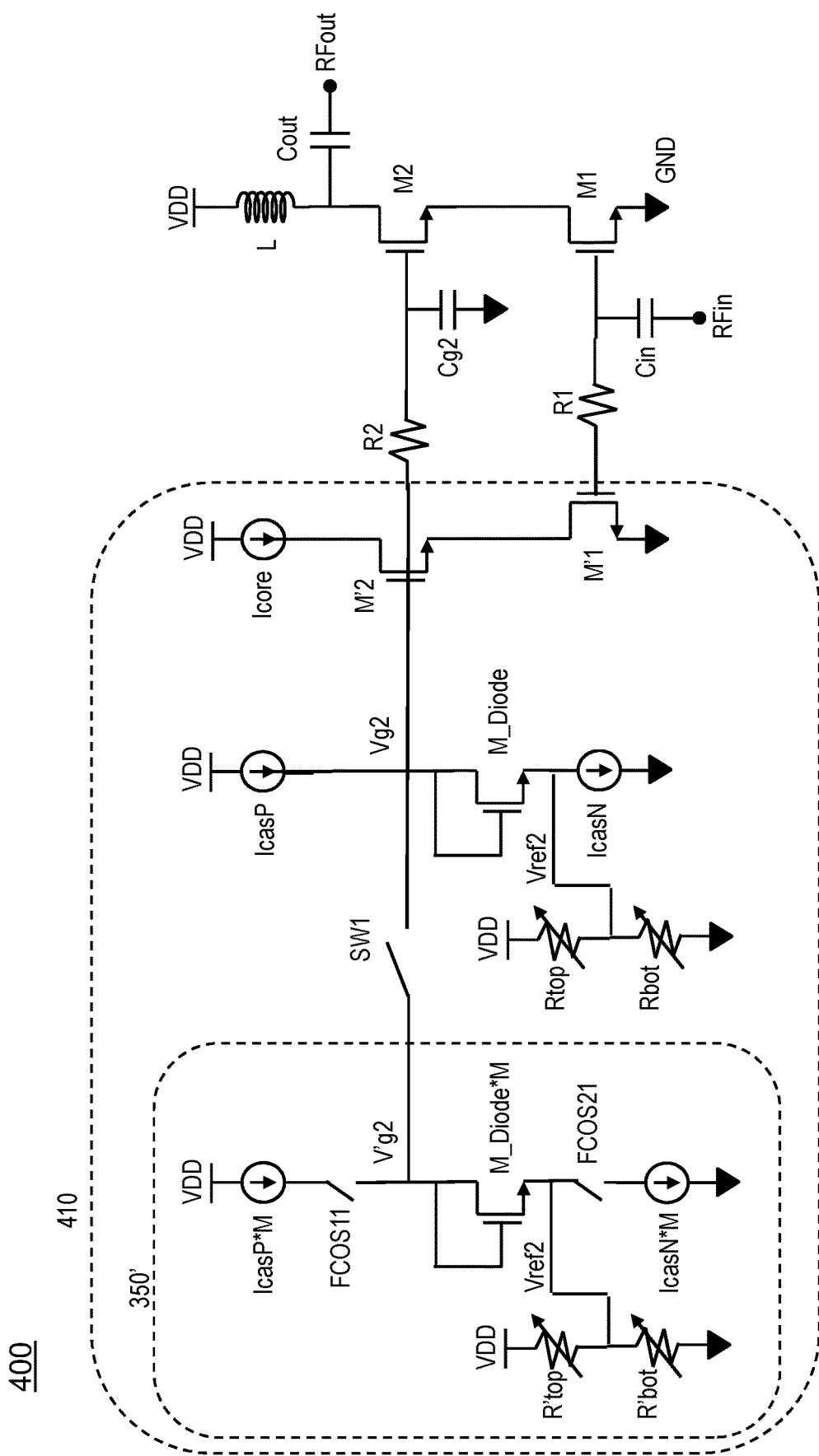
FIG. 4A shows a biasing circuit according to an embodiment of the present disclosure based on the embodiment depicted in FIG. 3A, where a switch is used to couple and decouple the current boost circuit to and from the biasing circuit.

FIG. 4A shows a biasing circuit (410) according to an embodiment of the present disclosure based on the biasing circuit (310a) depicted in FIG. 3A, where a switch, SW1, is used to selectively couple and decouple the current boost circuit (350') to and from the node Vg2 of the biasing circuit. Such added switch, SW1, can be used to couple the current boost circuit (350') to the node Vg2, and therefore to the gate of the cascode transistor M2, only when the current boost circuit (350') is activated (switches FOCS1, FOCS2 closed) and is at a stable operating condition, provided for example, to a same open or close state of the switches FOCS1 and FOCS2, and/or a same current sourced and sinked by the current sources IcasP and IcasN. In order to reduce any transients due to mismatch of voltages at nodes V'g2 and Vg2 prior to the closing of the switch SW1, voltages at such nodes are equalized by controlling the voltage at node V'g2 through a resistive voltage divider ($R'_{top}$, $R'_{bot}$) in a manner similar to the controlling of the voltage at node Vg2 through the resistive voltage divider ($R_{top}$, $R_{bot}$) described above. Furthermore, in order to also equalize effect of current flow from the diode connected transistors M_diode and M_diode*M through the respective resistive voltage dividers ($R_{top}$, $R_{bot}$) and ($R'_{top}$, $R'_{bot}$) during transient or mismatch conditions (e.g., mismatch between top (IcasP, IcasP*M) and bottom (IcasN, IcasN*M) current sources), according to an embodiment of the present disclosure, values of the resistors R' top and $R'_{bot}$ are chosen such that $R'_{top}=R_{top}/M$ and $R'_{bot}=R_{bot}/M$. Such selection of the resistor values can cause voltages at nodes Vg2 and V' g2 to track during the transient and/or mismatch conditions.

Figure 4B:
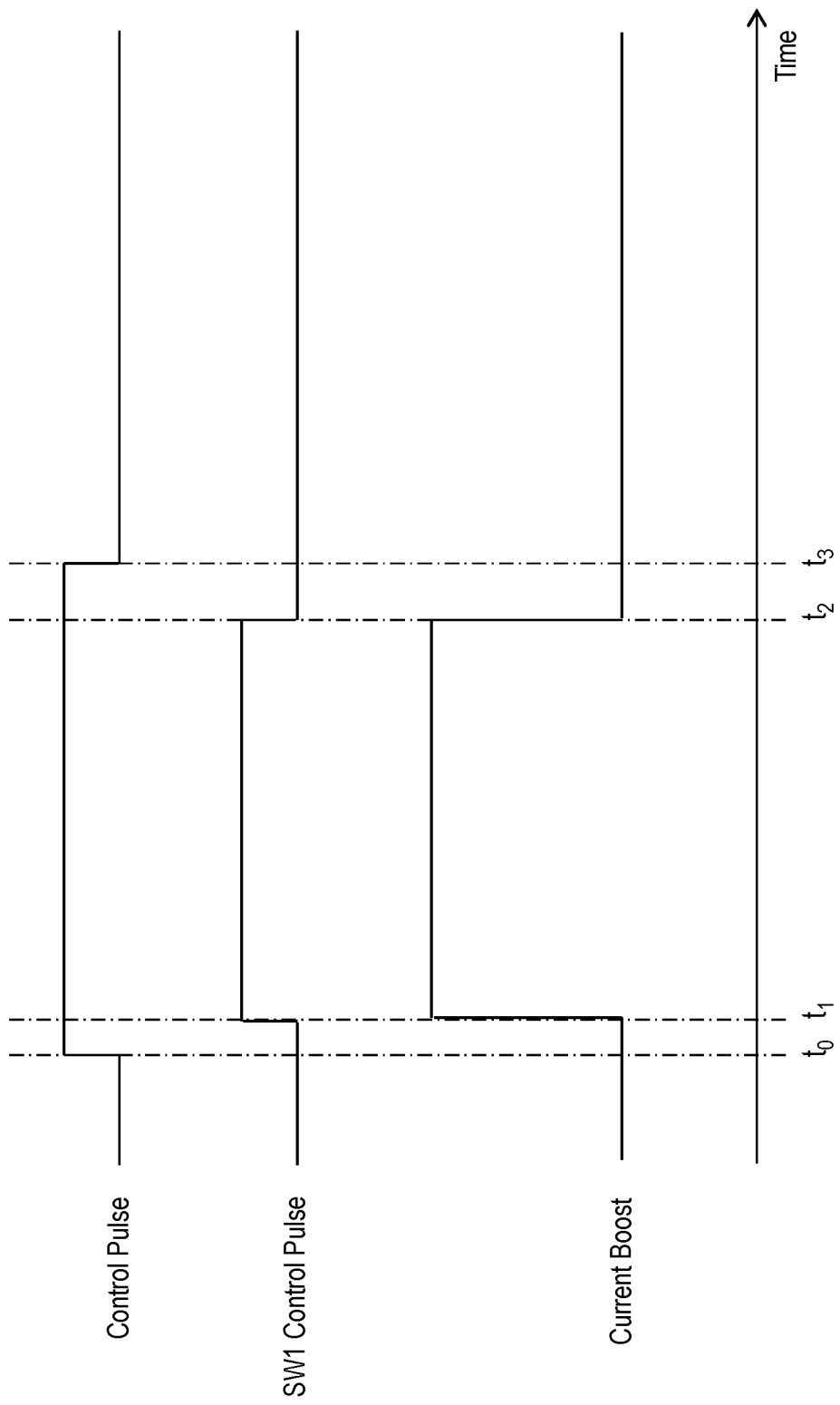
FIG. 4B shows graphs representing control timing for the switch SW1 relative to the control timing for current boost circuit (350) of the biasing circuit (410) shown in FIG. 4A.

FIG. 4B shows graphs representing control timing for the switch SW1 relative to the control timing for current boost circuit (350) of the biasing circuit (410) shown in FIG. 4A. As can be seen in FIG. 4B, the Control Pulse signal during which the current boost circuit (350') is activated starts at a time to, representing a start activation time of the current boost circuit (350') which can coincide with a time for a change in condition of operation of the cascode amplifier (M1, M2). At this time, the switches FCOS11 and FCOS21 are controlled to close (and the reference voltage, Vref2, controlled to change to a new value) and the current sources IcasN and IcasP may be activated. During the time period [$t_0$, $t_1$[the switch SW1 remains open so to allow the current boost circuit (350') to settle. A settling time of the current boost circuit (350') may be derived, for example, via circuit simulation and testing. At time $t_1$, the current boost circuit has settled to its nominal operating condition, the reference voltage Vref2 has a new value, and the switch SW1 is closed. Closing of the switch SW1 may starts injection of a boost current (positive or negative) from the current boost circuit (350') into the gate capacitor Cg2 so to charge (or discharge) the capacitor to a nominal value set by Vref2. At time $t_3$, the capacitor Cg2 is fully charged and the gate voltage Vg2 is at its nominal value. At time $t_3$, the switch SW1 is opened so to decouple the current boost circuit (350') form the gate of the cascode transistor M2, and therefore isolate the gate from any voltage perturbations related to the deactivation of the current boost circuit (350'). At time $t_4$, the current boost circuit (350') is deactivated, including opening of the switches FCOS11, FCOS21, and may be further deactivating of the current sources IcasN and IcasP. It should be noted that although the addition of the switch SW1 according to the present teachings depicted in FIG. 4A is shown relative to a biasing circuit (410) having a single current boost circuit (350'), for the same reasons described above, a similar switch can be used when the biasing circuit has a plurality of parallel current boost circuits (350') as shown for the programmable current boost circuit (350n) of FIG. 3B. In this case, the switch SW1 can be positioned between the node V'g2 of the programmable current boost circuit (350n) and the node Vg2. In such configuration, timing for the closing and opening of the switch SW1, respectively $t_1$ and $t_2$ of FIG. 4B, can be relative to a timing to and $t_3$ as shown in FIG. 4B, respectively corresponding to a start of activation of a first current boost circuit (350') and start of deactivation of a last current boost circuit (350') of the programmable current boost circuit (350n).

Figure 5A:
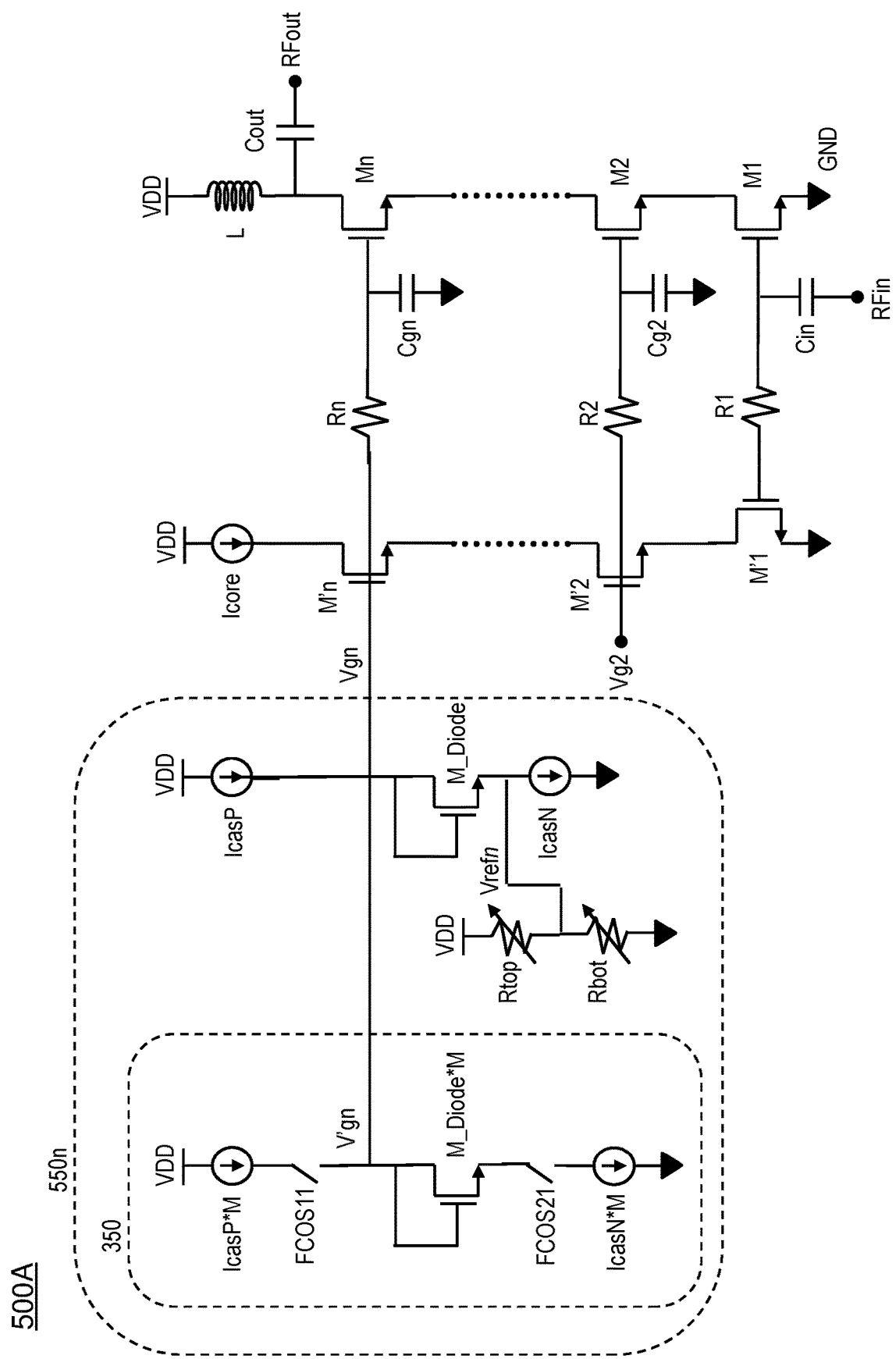
FIG. 5A shows a biasing circuit according to an embodiment of the present disclosure based on the embodiment depicted in FIG. 3A, where the biasing voltage is provided to a gate of an output transistor of the stacked cascode amplifier.
Figure 5B:
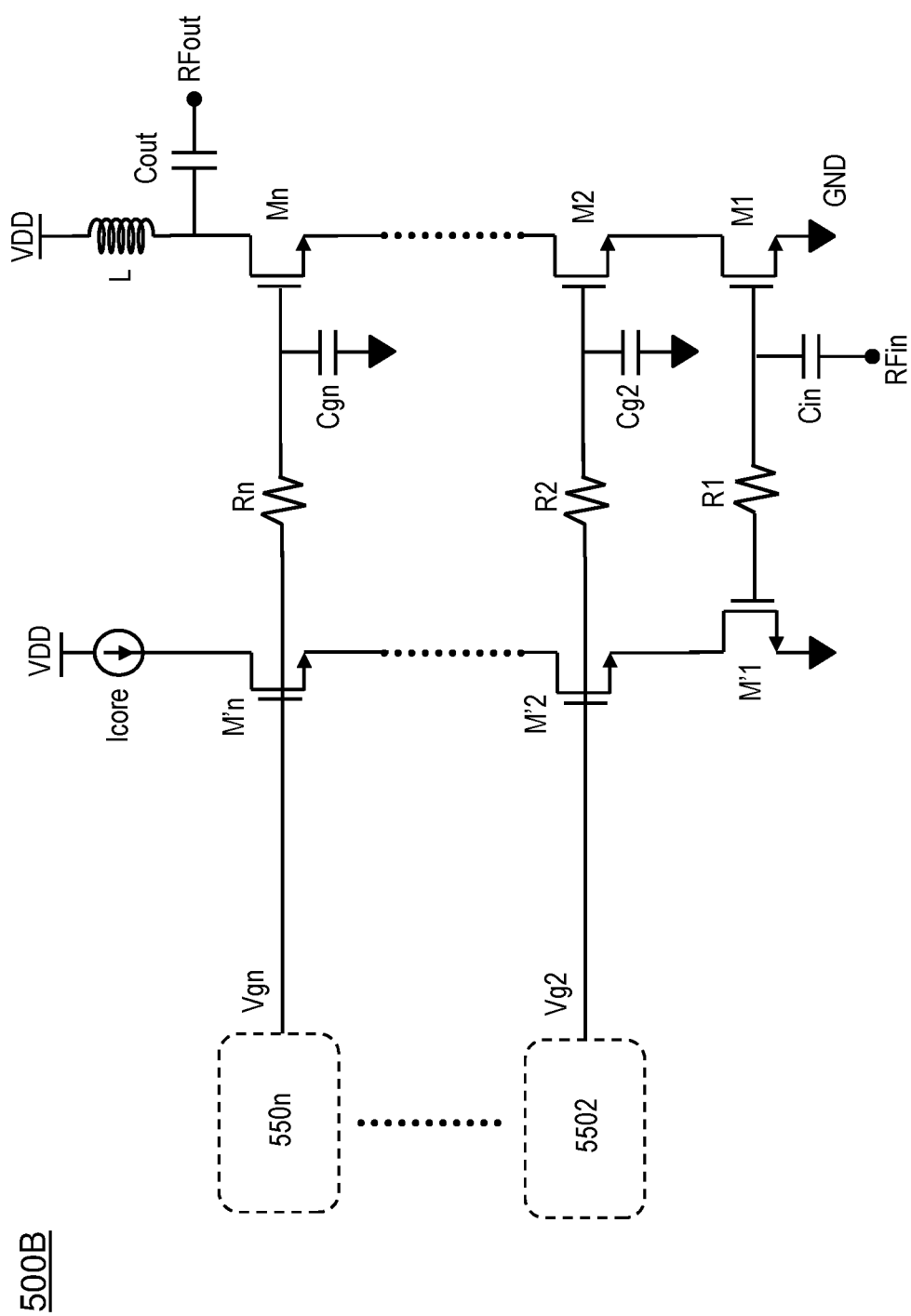
FIG. 5B shows a biasing circuit according to an embodiment of the present disclosure based on the embodiment depicted in FIG. 3A, where similar biasing circuits are used to provide biasing voltages to gates of a plurality of cascode transistors of the stacked cascode amplifier.

As described above, the cascode amplifier used in the various embodiments according to the present disclosure is not restricted to a cascode amplifier (M1, M2) with a stack height of two, having a single cascode transistor, M2, as shown in the exemplary embodiments of FIGS. 2-4, rather, any stack height for the cascode amplifier can be envisioned, as shown in FIG. 5A. In this case, one or more of the gate voltages (Vg2, . . . , Vgn) can be generated via a circuit similar to one described above in reference to FIGS. 2-4, where a current boost circuit (350) is used to reduce settling time of the gate voltages. In the exemplary embodiment according to the present disclosure shown in FIG. 5A, a biasing circuit (550n) comprising a current boost circuit (350) is used to generate the gate voltage Vgn for the output transistor Mn of the cascode amplifier (M1, M2, . . . , Mn). Principle of operation of the biasing circuit (550n) can be clearly derived from the above description. In this case, a reference voltage, Vrefn, set via, for example, a resistive divider, determines a value of the gate voltage, Vgn, which is obtained by charging the gate capacitor Cgn via the current boost circuit (350). It should be noted that the current boost circuit (350) may be a programmable current boost circuit (350n) as described above with reference to FIG. 3B. As shown in FIG. 5B, similar biasing circuits (5502, . . . , 550n) can be used for generation of the gate voltages (Vg2, . . . , Vgn).

With reference back to the prior art configuration depicted in FIG. 2 and as described above, the diode-connected transistor M_diode is selected to have a same current density as the cascode transistors M'2 and M2. Also, in view of a desired low current consumption of the biasing circuit (210) during the steady-state condition, a (standby) current through the diode-connected transistor M_diode is selected to be much smaller than currents through the reference circuit (M'1, M'2) and the amplifier circuit (M1, M2). For example, such (standby) current can be in the order of 75 μA, and may be obtained via a transistor (i.e., M_diode) with a basic geometry (e.g., gate width, gate length) that is different from a basic geometry used in the cascode transistors of the reference and amplifier circuits. Such requirement for same current densities while maintaining a low current consumption during the steady-state condition may be accomplished by first selecting the low current value, and then sizing the diode-connected transistor, M_diode to have the desired current density. In turn, this may result in the diode-connected transistor, M_diode, to have a gate width which is a fraction of a gate width used in the cascode transistors. For example, the cascode transistors (M'2, M2) may have one or a plurality of gates, each gate having a same width of about 4 whereas the diode-connected transistor, M_diode, may be a single finger transistor having a gate with a width of 1.2 μm for a corresponding low current of about 75 μA. A person skilled in the art would realize that not having same basic geometries in the transistors of the configuration depicted in FIG. 2 may result in a suboptimal matching of the transistors and therefore in a reduced tracking of the circuits with respect to parameters variability, such as, for example, process and temperature variations. In other words, due to the suboptimal matching, parameters variability may result in unequal tracking of the currents through the current sources IcasP and/or IcasN with respect to the currents through (M'1, M'2) and (M1, M2), and therefore may result in errors in the gate biasing voltage, Vg2. Such errors in the gate biasing voltage, Vg2, may in turn affect performance of the cascode amplifier (M1, M2), such as, for example, linearity and gain. It should be noted that a person skilled in the art is well aware of the concept of transistor matching which can result in perfect tracking of current densities of the matched transistors with respect to parameters variability (e.g., process, temperature). When matched, currents through the matched transistors are always equal to the ratios of the sizes of the matched transistors. Perfect matching may be provided through usage of the same geometries for the matched transistors.

With further reference to the prior art configuration of FIG. 2, the above discussed suboptimal matching can also introduce unequal tracking in currents through the IcasP and IcasN current sources, which in turn can generate a difference current (e.g., IcasP−IcasN) to flow in the resistive voltage divider (Rtop, Rbot) that can affect value of the reference voltage, Vref2. Accordingly, values of the resistors Rtop and Rbot are chosen to be low enough so that a current through such resistors during the steady-state condition is substantially equal to, or within the same order of magnitude of, the current through the diode-connected transistor, M_diode (e.g., nominal currents of the current sources IcasP, IcasN). This in turn can minimize an impact on a value of the reference voltage, Vref2, based on the flow of the difference current through the resistive voltage divider (Rtop, Rbot), but at the cost of a higher current through the resistive voltage divider.

Figure 6:
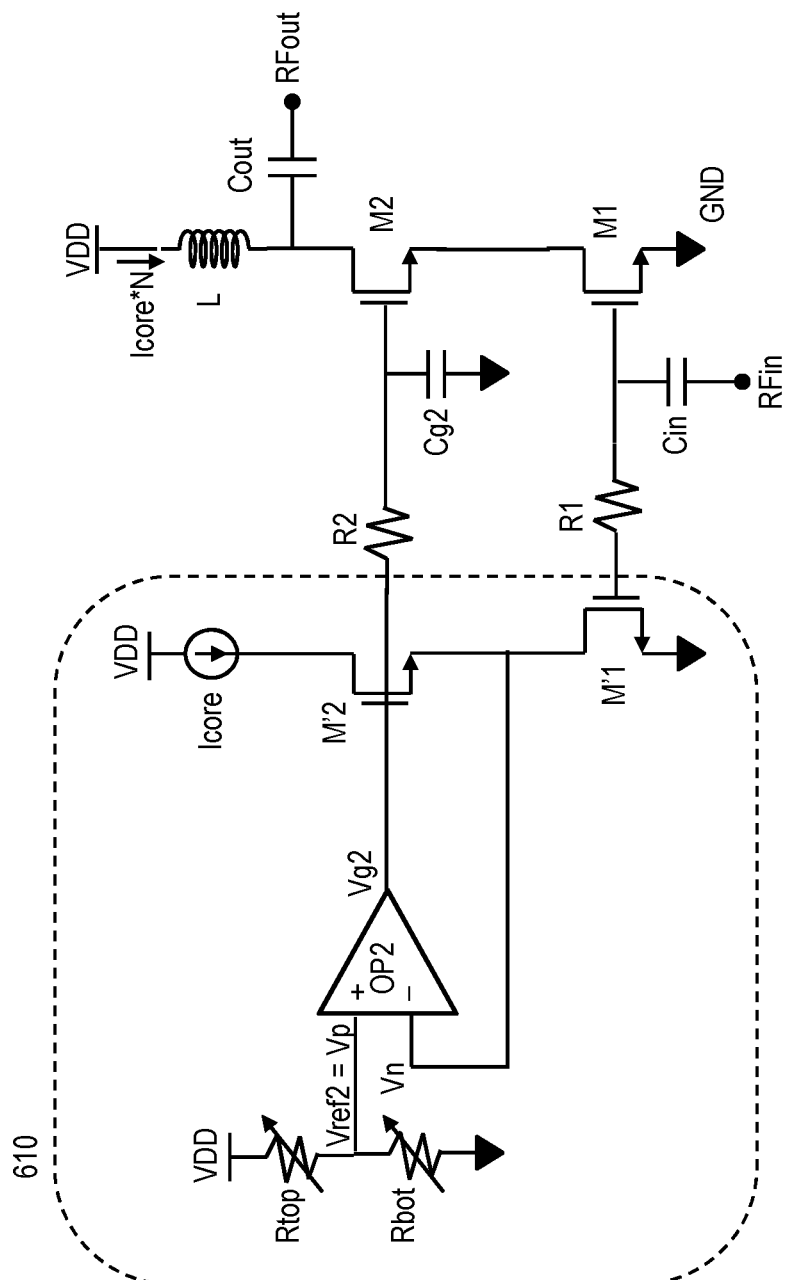
FIG. 6 shows a biasing circuit according to an embodiment of the present disclosure comprising a feedback loop to generate a biasing gate voltage of a cascode transistor of a stacked cascode amplifier.

Accordingly, it may be desirable to provide an alternative embodiment to the biasing circuit (210) of FIG. 2, such as the embodiment shown in FIG. 6, which can provide a high current during the transition phase, a low current during the steady-state condition, including a low current flowing in the resistive voltage divider, and not relying on a perfect matching of the transistors. FIG. 6 shows a biasing circuit (610) according to an embodiment of the present disclosure comprising a feedback loop realized around an operational amplifier (op-amp), OP2, to generate a gate voltage, Vg2, of a cascode transistor, M2, of a stacked cascode amplifier (M1, M2). Contrary to the prior art configuration depicted in FIG. 2, the present embodiment does not rely on matched transistors (e.g., M_diode) to set the gate voltage Vg2. Instead, an operational amplifier, OP2, is used to force a voltage at a source node of the cascode transistor M'2 of the reference circuit (M'1, M'2) to be equal to a reference voltage, Vref2, set, for example, via a resistive voltage divider (Rtop, Rbot).

As can be seen in FIG. 6, the positive input, Vp, of the op-amp, OP2, is connected to a common node of the two resistors (Rtop, Rbot) for provision of the reference voltage, Vref2, and the negative input, Vn, of the op-amp, OP2, is connected to the source node of the cascode transistor M'2, to provide a feedback loop that controls the output node, Vg2, of the op-amp, OP2, so that the source node of the cascode transistor M'2 remains equal to Vp=Vref2. This in turn controls the gate-to-source voltage of the cascode transistor M'2 so as to maintain the current Icore flowing through the reference circuit (M'1, M'2), and therefore a current Icore*N through the staked cascode amplifier (M1, M2). Since the op-amp, OP2, can have an infinite gain (e.g., very large gain) as well as a high output current drive capability (sourcing and sinking), its output node, Vg2, coupled to the gate of the cascode transistors (M'2, M2), can quickly respond to a change in the reference voltage, Vref2, and quickly charge or discharge the gate capacitor, Cg2.

With continued reference to FIG. 6, because feedback is provided via sensing of the source node of the cascode transistor M'2, which is same as the drain node of the cascode transistor M'1, and because an RF signal processed (amplified) by the amplifier circuit (M1, M2) is substantially decoupled from the reference circuit (M'1, M'2), a high bandwidth (i.e., high response) of the op-amp, OP2, can be implemented without consideration of a frequency of the RF signal. Therefore, a fast settling time of the gate voltage Vg2 can be obtained, mainly based on the high slew rate of the op-amp and its high current driving capability. In other words, isolation of the RF signal processed by the amplifier circuit (M1, M2) from the reference circuit (M1, M'2) by way of the resistors (R1, R2) allows for a higher gain of the feedback loop provided by the op-amp OP2. It should be noted that a person skilled in the art is well aware of many design techniques to implement the op-amp, OP2, including, for example, design for low standby current (e.g., about 60 µA or less), high current sourcing/sinking capability (e.g., source follower output stage), and high slew rate, which design techniques are outside the scope of the present disclosure.

With continued reference to FIG. 6, as the reference circuit (M'1, M'2) is a scaled down replica (e.g., $1/20^{th}$ or less, such as, for example, $1/30^{th}$, $1/40^{th}$, . . . , 1/Nth with N≥20) version of the amplifier circuit (M1, M2), with the current (Icore*N) through the amplifier circuit (M1, M2) provided via mirroring of the current (Icore) through the reference circuit (M'1, M'2), as described above with reference to the prior art configuration depicted in FIG. 2, the cascode transistors M'2 and M2 have a same gate-to-source voltage and therefore the source of cascode transistor M2 is also equal to Vref2. It should be noted that as discussed above with reference to FIG. 2, same biasing voltages may be applied to the amplifier circuit (M1, M2) and the reference circuit (M'1, M'2), and a ratio of the biasing currents through the reference circuit (M'1, M'2) and the amplifier circuit (M1, M2) may be substantially equal to a ratio of the sizes of the transistors of the two circuits (e.g., Icore*N/Icore=N).

With further reference to the biasing circuit (610) of FIG. 6, a person skilled in the art would clearly understand that substantially zero current flows from the resistive voltage divider (Rtop, Rbot) into the positive input, Vp, of the op-amp, OP2. Therefore, resistor values Rtop and Rbot can be selected to be very large so that a very low current flows into the resistive voltage divider (Rtop, Rbot). According to an exemplary embodiment of the present disclosure, such resistors are selected so a current of about 1 µA or less (e.g., less than 1 µA) flows through the resistive voltage divider (Rtop, Rbot). A person skilled in the art would appreciate such reduction in current provided by the present teachings when compared to the current required in the operation of the prior art configuration of FIG. 2 described above (e.g., 75 µA). Furthermore, a person skilled in the art would appreciate that selection of the resistor values Rtop and Rbot can provide an arbitrary low current flow through the resistive voltage divider (Rtop, Rbot) that is independent from a current sourced or sinked by the op-amp OP2 to charge or discharge the gate capacitor Cg2.

As it is well known to a person skilled in the art, industry trend may favor lower $V_{DD}$ supply voltages which may be limited in the prior art configuration of FIG. 2 due to a voltage headroom required for operation of the current source circuit IcasP. Such voltage headroom, which may be about 200 mV, is necessary for the current source circuit IcasP to output a constant nominal current. On the other hand, in the embodiment according to the present teachings shown in FIG. 6, the op-amp, OP2, does not require such headroom and therefore the biasing circuit (610), including the op-amp, OP2, may operate on a lower supply voltage, $V_{DD}$, when compared to the prior art biasing circuit (210) shown in FIG. 2.

Figure 7:
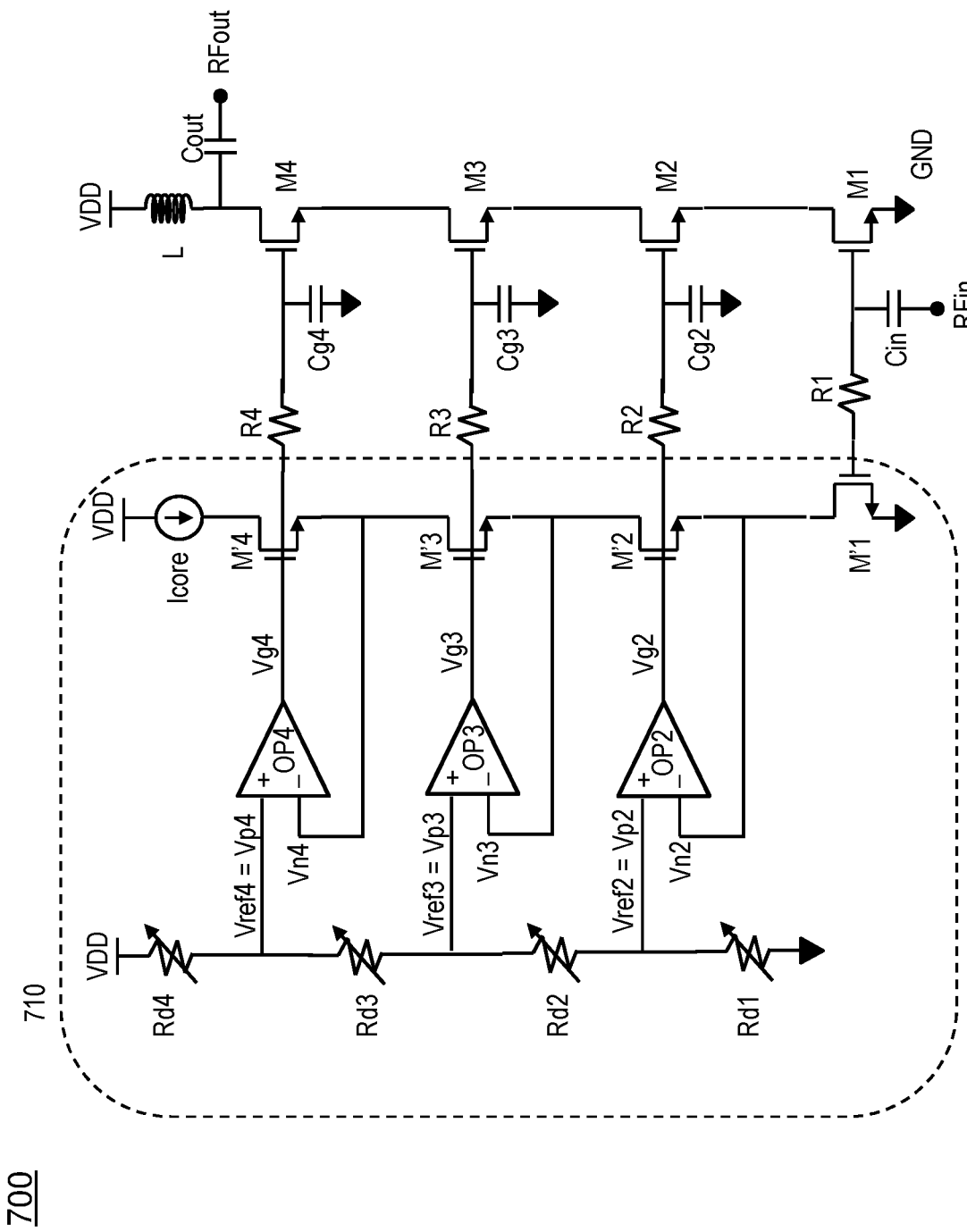
FIG. 7 shows a biasing circuit according to an embodiment of the present disclosure based on the embodiment depicted in FIG. 6, where similar biasing circuits are used to provide biasing voltages to gates of a plurality of cascode transistors of the stacked cascode amplifier.

As described above, the cascode amplifier used in the various embodiments according to the present disclosure is not restricted to a cascode amplifier (M1, M2) with a stack height of two, having a single cascode transistor, M2, as shown in the exemplary embodiment of FIG. 6, rather, any stack height for the cascode amplifier can be envisioned. FIG. 7 shows an exemplary embodiment according to the present disclosure, where a biasing circuit (710), based on the biasing circuit (610) of FIG. 6, is used to provide biasing voltages Vg2, Vg3, Vg4, to gates of a cascode amplifier circuit (M1, M2, M3, M4) having a stack height of four.

As can be seen in FIG. 7, source nodes of each of the cascode transistors (M'2, M'3, M'4) of the reference circuit (M'1, M'4) is forced to take a value of a respective reference voltage (Vref2, Vref3, Vref4) generated by respective nodes of a resistive voltage divider (Rd1, . . . , Rd4) coupled to respective positive inputs (Vp2, Vp3, Vp4) of respective op-amps (OP2, OP3, OP4). In other words, each gate-to-source voltage of the cascode transistors (M'2, M'3, M'4) is controlled via a feedback loop similar to one described above with respect to the configuration (600) depicted in the FIG. 6.

Figure 8:
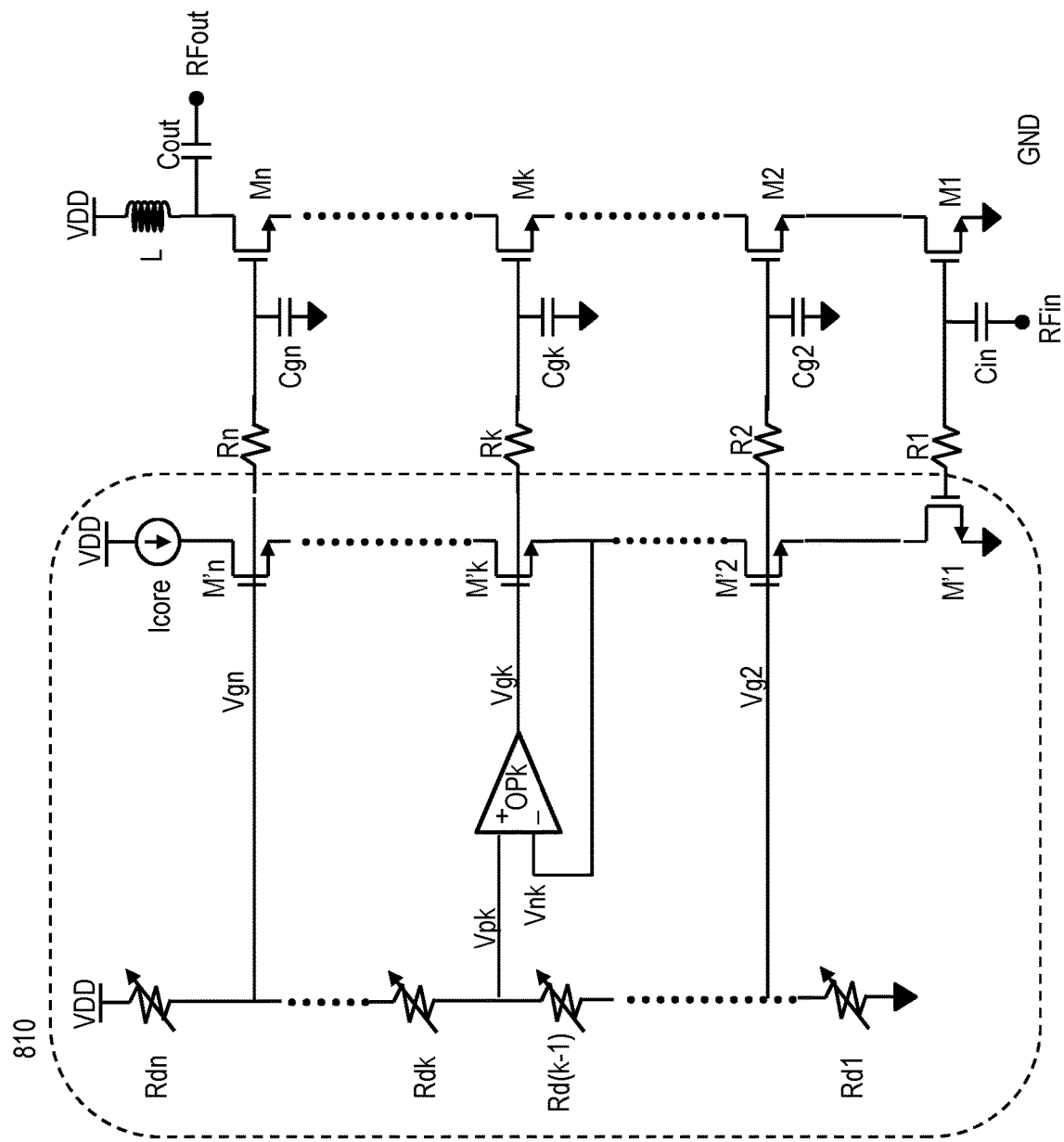
FIG. 8 shows a biasing circuit according to an embodiment of the present disclosure based on the embodiment depicted in FIG. 6, where the biasing gate voltage is provided to a gate of a cascode transistor of a stacked cascode amplifier having a plurality of cascode transistors.

FIG. 8 shows an exemplary biasing circuit (810) according to an embodiment of the present disclosure based on the embodiment depicted in FIG. 6, where a biasing gate voltage, Vgk, is provided to a gate of a cascode transistor, Mk, of a stacked cascode amplifier (M1, . . . , Mk, . . . , Mn) having a plurality of cascode transistors M2 . . . , Mk, . . . , Mn. Principle of operation of the biasing circuit (810) for generating of the gate voltage, Vgk, is similar to one described above with reference to generation of Vg2 gate voltage of FIG. 6, where the op-amp, OPk, is used in a feedback loop to force a source node of a cascode transistor, M'k, of the reference circuit (M'1, . . . , M'k, . . . , M'n) to be equal to a reference voltage, Vpk, and accordingly control the gate voltage, Vgk. Based on the embodiments according to the present teachings depicted in FIGS. 6, 7 and 8, a person skilled in the art would clearly understand that for any one or more of the gate voltages Vg2, . . . , Vgn, generation of a gate voltage of a cascode amplifier (M1, . . . , Mn), where n can be any integer equal to, or greater than, two, can be accomplished by an amplifier operating in feedback loop to force a source voltage to a reference voltage and accordingly control the gate voltage. It should be noted that although the exemplary configuration shown in FIG. 8 shows other gate voltages (different from Vgk) directly generated via common nodes of a common resistive divider (Rd1, . . . , Rdn), other biasing schemes for providing such gate voltages, such as, for example, as described in the above referenced U.S. Pat. No. 9,843,293, the disclosure of which is incorporated herein by reference in its entirety. may also be envisioned.

It should be noted that although the above embodiments according to the present disclosure are presented with respect to a stacked cascode amplifier which is shown to be powered by a substantially fixed supply voltage, $V_{DD}$, such as, for example, a battery voltage, other configurations of such stack cascode amplifier where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, $RF_{in}$, or the output RF signal, $RF_{out}$. Detailed description of such amplifiers operating from a variable supply voltage can be found, for example, in the above referenced U.S. Pat. Nos. 9,716,477, 9,219,445, and 9,413,298, the disclosures of which are incorporated herein by reference in their entirety. A person skilled in the art would also know of configurations where the supply to the amplifier is in the form of a current source instead of the exemplary voltage source (e.g., $V_{DD}$) discussed in the present disclosure. The teachings according to the present disclosure equally apply to such diverse supply configurations. The exemplary case of a (substantially) fixed supply discussed in the present disclosure should not be considered as limiting what the applicant considers to be the invention. Furthermore, although an exemplary non-limiting case of a single ended RF amplifier configuration is discussed in the above embodiments, the teachings according to the present disclosure equally apply to other amplifier configurations using stacked transistors, such as, for example, differential configurations. Some such configurations are described in, for example, the above referenced U.S. Pat. No. 9,413,298, the disclosure of which is incorporated herein by reference in its entirety.

Although N-type MOSFETs are used to describe the embodiments in the present disclosure, a person skilled in the art would recognize that other types of transistors such as, for example, P-type MOSFETs and bipolar junction transistors (BJTs) can be used instead or in combination with the N-type MOSFETs. Furthermore, a person skilled in the art will also appreciate the advantage of stacking more than two transistors, such as three, four, five or more, provide on the voltage handling performance of the amplifier. This can for example be achieved when using non bulk-Silicon technology, such as insulated silicon-on-insulator (SOI) or Silicon-on-Sapphire (SOS) technologies. In general, individual devices in the stack can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

It should be noted that the various embodiments of the biasing circuits according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed:

1. A circuit arrangement comprising:
   a first stack of a plurality of series connected transistors for operation as an RF amplifier;
   a second stack of a plurality of series connected transistors, gate nodes of the second stack coupled to respective gate nodes of the first stack via respective resistors; and
   a biasing circuit configured to provide a biasing voltage to at least one gate node of a transistor of the first stack different from an input transistor of the first stack and a gate node of a respective transistor of the second stack,
      wherein the biasing circuit comprises a feedback loop that senses a voltage at a source node of the respective transistor of the second stack and controls the biasing voltage to the at least one gate node based on a difference between a sensed voltage at said source node and a reference voltage, and
      wherein the respective resistors are configured to substantially isolate the second stack from an RF signal that flows through the first stack.

2. The circuit arrangement according to claim 1, wherein the feedback loop controls the biasing voltage to the at least one gate node so that the sensed voltage at said source node is equal to the reference voltage.

3. The circuit arrangement according to claim 1, wherein control of the biasing voltage is provided by charging and discharging of a capacitor at said gate node by a current output by the feedback loop.

4. The circuit arrangement according to claim 3, wherein the charging and discharging of the capacitor is through a resistor of the respective resistors that is coupled to the at least one gate node.

5. The circuit arrangement according to claim 1, wherein the feedback loop comprises an operational amplifier comprising a positive input coupled to the reference voltage, a negative input coupled to the source node of the respective transistor of the second stack, and an output coupled to the at least one gate node.

6. The circuit arrangement according to claim 1, wherein the reference voltage is generated via a resistive voltage divider comprising two series connected resistors.

7. The circuit arrangement according to claim 6, wherein the two series connected resistors comprise at least one configurable resistor.

8. The circuit arrangement according to claim 6, wherein a current through the resistive voltage divider is 1 µA or less.

9. The circuit arrangement according to claim 5, wherein a magnitude of the current output by the of the operational amplifier is independent from a magnitude of a current that generates the reference voltage.

10. The circuit arrangement according to claim 1, wherein the second stack is a scaled down version of the first stack, and a scale of the second stack with respect to the first stack is 1/20 or less.

11. The circuit arrangement according to claim 1, wherein the at least one gate node is a gate node of an output transistor of the plurality of series connected transistors of the first stack.

12. The circuit arrangement according to claim 1, wherein the at least one gate node is a gate node of a transistor of the plurality of series connected transistors of the first stack that is connected to an input transistor of the plurality of series connected transistors of the first stack.

13. The circuit arrangement according to claim 1, wherein the at least one gate node is a gate node of a transistor of the plurality of series connected transistors of the first stack that is not an output transistor of the plurality of series connected transistors of the first stack and that is not directly connected to an input transistor of the plurality of series connected transistors of the first stack.

14. The circuit arrangement according to claim 1, wherein:
   the biasing circuit is further configured to provide an additional biasing voltage to a gate node of an additional transistor of the first stack and a gate node of a respective additional transistor of the second stack,
      wherein the biasing circuit further comprises an additional feedback loop that senses an additional voltage at a source node of the respective additional transistor of the second stack and controls the additional biasing voltage based on the sensing of the additional voltage.

15. The circuit arrangement according to claim 14, wherein control of the additional biasing voltage is provided by charging and discharging of an additional capacitor at the gate node of said additional transistor by a current output by the additional feedback loop.

16. The circuit arrangement according to claim 1, wherein the plurality of series connected transistors of the first stack comprises an input transistor that is coupled to a reference ground via a degeneration inductor.

17. The circuit arrangement according to claim 16, wherein the RF amplifier is a low noise amplifier (LNA) used in a receive path of an RF system.

18. The circuit arrangement according to claim 1, wherein the plurality of series connected transistors of the first and second stacks are FET transistors.

19. The circuit arrangement according to claim 18, wherein the FET transistors are fabricated using one of: a) silicon-on-insulator (SOI) technology, and b) silicon-on-sapphire technology (SOS).

20. An electronic module comprising the circuit arrangement of claim 1.

21. A method for biasing a first stack of a plurality of series connected transistors for operation as a radio frequency amplifier, the method comprising:

provide a second stack of a plurality of series connected transistors;

coupling gate nodes of the first stack to respective gate nodes of the second stack via respective resistors, thereby isolating an RF signal flowing through the first stack from the second stack; and controlling, via a feedback loop, a biasing voltage to a gate node of a transistor of the first stack different from an input transistor of the first stack based on a voltage sensed at a source node of a respective transistor of the second stack.

22. The method according to claim 21, wherein the controlling comprises charging and discharging of a capacitor at said gate node by a current output by the feedback loop.

* * * * *